US006828556B2

(12) United States Patent
Pobanz et al.

(10) Patent No.: US 6,828,556 B2
(45) Date of Patent: Dec. 7, 2004

(54) MILLIMETER WAVE IMAGING ARRAY

(75) Inventors: Carl W. Pobanz, Rancho Palos Verdes, CA (US); Mehran Matloubian, Encino, CA (US); Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 103 days.

(21) Appl. No.: 10/256,335

(22) Filed: Sep. 26, 2002

(65) Prior Publication Data

US 2003/0122079 A1 Jul. 3, 2003

(Under 37 CFR 1.47)

Related U.S. Application Data

(60) Provisional application No. 60/326,053, filed on Sep. 28, 2001.

(51) Int. Cl.$^7$ ............................................... H01Q 21/00
(52) U.S. Cl. ............................. 250/336.1; 343/700 MS
(58) Field of Search ................. 250/336.1; 343/700 MS

(56) References Cited

U.S. PATENT DOCUMENTS

| | | | |
|---|---|---|---|
| 4,910,523 A | 3/1990 | Huguenin et al. | 342/179 |
| 5,202,692 A | 4/1993 | Huguenin et al. | 342/179 |
| 5,237,334 A | 8/1993 | Waters | 343/753 |
| 5,438,336 A | 8/1995 | Lee et al. | 342/174 |
| 5,530,247 A | 6/1996 | McIver et al. | 250/336.1 |
| 5,815,113 A | 9/1998 | Lo et al. | 342/351 |

OTHER PUBLICATIONS

Kenjiro Nishikawa et al., "Three–Dimensional MMIC Technology for Low–Cost Millimeter–Wave MMICs." Sep., 2001. IEEE Journal of Solid–State Circuits, vol. 36, No. 9, pp. 1351–1359.*

Kenjiro Nishikawa et al., "Miniaturized Millimeter–Wave Masterslice 3–D MMIC Amplifier and Mixer." Sep., 1999. IEEE Transactions on Microwave Theory and Techniques, vol. 47, No. 9, pp. 1856–1862.*

Ichihiko Toyoda et al., "Highly Integrated Three–Dimensional MMIC Single–Chip Receiver and Transmitter." Dec., 1996. IEEE Transactions on Microwave Theory and Techniques, Vo. 44, No. 12, pp. 2340–2346.*

Kuroda, R.T., et al, "Large Scale W–Band Focal Plane Array Developments for Passive Millimeter Wave Imaging," *Passive Millimeter–Wave Imaging Technology II*, Proceedings of the SPIE—The International Society of Optical Engineering, vol. 3378, pp. 57–62 (Apr. 1998).

Ferendeci, A. M., "Monolithically Processed Vertically Interconnected 3D Phased Array Antenna Module," *IEEE Proceedings, National Aerospace and Electronics Conference 2000*, pp 153–155 (Oct. 12, 2000).

Seki, T., et al., "Active Antenna Using Multi–Layer Ceramic–Polyimide Substrates for Wireless Communication System," *Microwave Symposium Digest, 2001 IEEE MTT–S International*, pp 385–388 (May 25, 2001.).

* cited by examiner

*Primary Examiner*—Constantine Hannaher
(74) *Attorney, Agent, or Firm*—Ladas & Parry

(57) ABSTRACT

A focal plane array for millimeter wave imaging comprising a three dimensional stack of antenna elements and radiometer microwave monolithic integrated circuits (MMICs) embedded in polymer dielectric layers built on top of a silicon substrate. Each radiometer MMIC and antenna element comprise a radiometer pixel. The silicon substrate contains integrated circuits to collect and process the signals from each radiometer pixel and generate a full-frame video signal. The array can be fabricated on a single silicon wafer or can be constructed from structures fabricated on multiple silicon wafers.

25 Claims, 3 Drawing Sheets

MILLIMETER WAVE IMAGING ARRAY

CROSS-REFERENCE TO RELATED APPLICATIONS

The present document is related to and claims the benefit of the copending and commonly assigned patent application document entitled: "Millimeter Wave Imaging Array," Serial No. 60/326,053, filed on Sep. 28, 2001. The contents of this application is hereby incorporated by reference herein. The present document is also related to the following copending and commonly assigned patent application documents: "Process for Assembling Three-Dimensional Systems on a Chip and Structure Thus Obtained," Serial No. 60/326,076; "Process For Producing High Performance Interconnects," Serial No. 60/326,054; "Method For Assembly Of Complementary-Shaped Receptacle Site And Device Microstructures," Serial No. 60/326,055; and "Method of Self-Latching for Adhesion During Self-Assembly of Electronic or Optics Circuits," Serial No. 60/326,056, all of which were filed on Sep. 28, 2001. The contents of these related applications are hereby incorporated by reference herein.

BACKGROUND

1. Field

This invention relates generally to millimeter wave imaging systems and, more particularly, to a millimeter wave imaging system including a highly-integrated millimeter wave focal plane radiometer array.

2. Description of Related Art

Generation of images responsive to detected millimeter waves (radiation having wavelengths in approximately the 1 cm–1 mm range, that is, frequencies between 30 GHz and 300 GHz) reflected from or emitted by objects in a field of view is desired in many applications. This is largely because millimeter waves penetrate many materials that are opaque to visible and infrared radiation, enabling high-resolution imaging of scenes that were previously invisible. For example, millimeter wave imagers could provide landing assistance to aircraft for runways obscured by fog. Additionally, millimeter wave imagers could provide images of weapons concealed beneath clothing, since human bodies and metal objects have different optical properties at millimeter wavelengths.

Since all objects reflect and emit millimeter waves, passive imaging can be used to detect the natural millimeter wave emissions or reflections from objects or people. The emissivity range of objects at millimeter waves is very large, approximately ten times greater than the range provided by infrared, so high contrast images can be made using existing blackbody radiation. A passive imager uses sensitive receivers to distinguish small differences in millimeter wave emissions. The emitted radiation is processed by the detector which converts the millimeter wave emissions down to a video signal. The strength of the video signal is roughly proportional to the power level in the emitted radiation.

Creating an image from emitted millimeter wave radiation has been historically difficult due to the lack of small, sensitive millimeter wave detectors that can be easily arrayed. Early versions of millimeter wave imaging systems used mechanical or electronic scanning of the millimeter wave sensor. Mechanical systems physically move a sensor through a range of azimuths, elevations, or both, defining a field of view. Such systems are complex and subject to failure. Electronic scanning typically requires employment of electronic phase shifting or switching techniques which are relatively complex to implement at millimeter wave frequencies.

Later generations of millimeter wave imaging systems used focal plane arrays of millimeter wave detectors. These systems are characterized by the use of conventional two dimensional integration of electronics using circuit board techniques. U.S. Pat. No. 4,910,523 issued Mar. 20, 1990 to R. G. Huguenin, et al, discloses a focal plane array comprising multiple circuit boards disposed in a horizontal direction where each circuit board has multiple detectors disposed in a vertical direction. U.S. Pat. No. 5,438,336 issued Aug. 1, 1995 to P. S. C. Lee, et al, also discloses a focal plane array for millimeter wave imaging. In Lee, an array of pixels are used for detection of millimeter wave images. Each pixel comprises an antenna, a low noise amplifier, a band pass filter and a video detector. However, Lee discloses using discrete parts for these elements, so the level of integration occurs at the level of a single pixel, and the pixels would be constructed using circuit board techniques. Lee also discloses that signal processing of the detected signal is done externally to the individual pixels.

A millimeter wave video camera operating at 89 GHz is disclosed by R. T. Kurado et al., in "Large Scale W-Band Focal Plane Array Developments for Passive Millimeter Wave Imaging," SPIE Conference on Passive Millimeter-Wave Imaging Technology, April 1998, pp. 57–62. The millimeter wave imager disclosed by Kurado is approximately 30 inches on a side and is assembled using hybrid circuit-card techniques. The focal plane detector within the disclosed imager uses 1040 MMICs and antennas, along with 15,860 resistors, capacitors, and silicon integrated circuits interconnected by 36,920 wire bonds.

U.S. Pat. No. 5,237,334 issued Aug. 17, 1993 to W. M. Waters discloses a focal plane antenna array comprising a plurality of conical horns and circular waveguides. The waveguide array is constructed by perforating an aluminum plate to provide passages defining the waveguides. Diodes are then manually assembled into each aperture to provide detection of millimeter waves. Signal processing of the detected millimeter waves is done by a separate signal processing module. Conventional wiring leads are used to connect the array of detectors to the signal processing module.

All of the systems discussed above use conventional circuit board integration where components are serially picked-and-placed into a primarily two dimensional structure. These systems suffer from a large size and time-consuming serial assembly resulting from the use of conventional two dimensional module-style integration to implement a dense, inherently three-dimensional array. Such systems also exhibit degraded system performance due to unnecessarily long interconnections between electronic components. Construction of large, costly detector elements may force the use of sparsely-populated arrays with image resolution that falls well short of theoretical limits. Attempts to save space by sharing and multiplexing one video processor among a number of detector elements, or by using mechanically scanned optics, results in slow refresh rates that are inadequate for real-time video. These limitations have prevented widespread deployment of millimeter wave imaging technology.

In light of the discussion above, there exists a need in the art for a compact focal plane array for millimeter wave imaging. Specifically, such an array should maximize integration of the elements required for millimeter wave imaging while minimizing reliance on conventional circuit board assembly techniques. Such an array should also allow for minimum spacing of array elements to achieve maximum resolution as well as minimizing circuit interconnection lengths.

SUMMARY

It is an object of the present invention to provide a compact focal plane array for millimeter wave imaging that can be assembled with a minimal reliance on conventional circuit board assembly techniques. It is a further object of the present invention to allow elements of a millimeter wave focal plane array to be spaced to achieve maximum resolution of an image processed by the array. It is another object of the present invention to provide the capability for real-time video based on detected millimeter wave radiation.

The present invention comprises a three-dimensional, integrated focal plane radiometer array structure for millimeter wave imaging. The structure comprises one or more layers of polymer films containing encapsulated semiconductor devices, transmission lines, and circuit interconnects which are positioned on top of a substrate. The substrate contains multiple integrated circuits interconnected and connected to the semiconductor devices in the layers above. The top layer of the structure contain antenna elements which have been disposed upon a dielectric. The antenna elements are connected to the semiconductor devices in the layers below. The small size of the semiconductor devices and the integrated circuits allows the antenna elements to be closely spaced and minimizes the interconnection lengths between the antenna elements, the semiconductor devices, and the integrated circuits. The small spacing of antenna elements allows the focal plane array to produce a very high resolution image. Minimization of interconnection lengths provides that system noise is reduced and allows a real-time update rate to be used in imaging a scene.

A first embodiment of the present invention is provided by a substrate comprising a plurality of integrated circuits; one or more receptacle layers positioned on top of the substrate, the receptacle layers each comprising a plurality of microwave monolithic integrated circuits encapsulated in a polymer film, the plurality of the microwave monolithic integrated circuits connecting to the plurality of the integrated circuits by vertical interconnects; and an antenna carrying layer comprising: a dielectric layer and a plurality of antenna elements positioned on top of the dielectric layer, the plurality of antenna elements connecting to the plurality of the microwave monolithic circuits by vertical interconnects through the dielectric.

A second embodiment of the present invention is provided by a focal plane array structure comprising: a semiconductor wafer; a plurality of integrated circuits formed within the semiconductor wafer; one or more receptacle layers positioned on top of the silicon wafer, each receptacle layer comprising a plurality of microwave monolithic integrated circuits encapsulated in a polymer film; and an antenna carrying layer positioned on top of the receptacle layer, the antenna carrying layer comprising: a dielectric layer and a plurality of antenna elements positioned on top of the dielectric layer.

The small size of the microwave imaging array provided by the present invention allows for the deployment of a complete millimeter wave imaging system within a small, preferably handheld, enclosure. Such a millimeter wave imaging system comprises: a millimeter wave focal plane array producing full image video, said array comprising: a substrate containing a plurality of integrated circuits; one or more receptacle layers, each receptacle layer comprising a plurality of integrated circuits encapsulated in a polymer film; and an antenna carrying layer; and a lens directing the viewed scene onto the focal plane array; a processing unit receiving the full image video and producing a display video signal; and a video display creating a visual display from the display video signal.

DETAILED DESCRIPTION OF PREFERRED EMBODIMENTS

Figure 1:
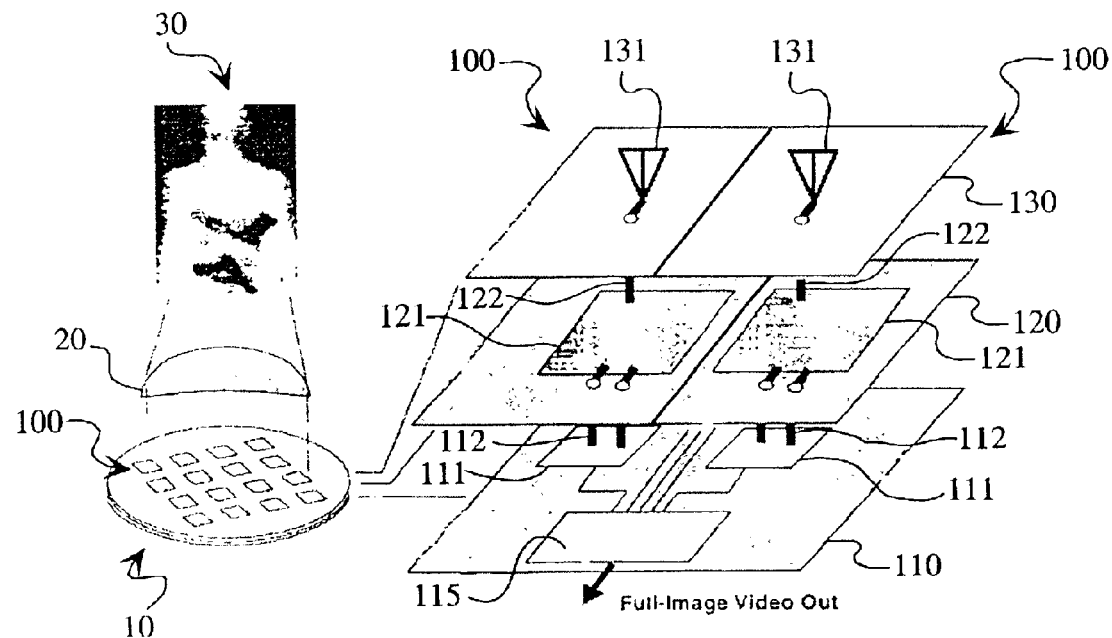
FIG. 1 shows a simplified representation of a millimeter wave focal plane array provided by the present invention and an exploded view of two pixels within the array.

Referring now to FIG. 1, a simplified representation of the millimeter wave focal plane array in accordance with the present invention is shown. Millimeter radiation from a scene 30 is directed onto a focal plane array 10 by Gaussian optics 20 or other millimeter wave focusing devices. Millimeter wave focusing devices include refractive optical devices made of plastic lens and reflective optical devices in a Cassegrain configuration. Other focusing devices known in the art may also be used.

The focal plane array 10 includes a plurality of radiometer pixels 100. Each radiometer pixel 100 has a size on the order of a single millimeter wave length, so each radiometer pixel 100 may have an area from around 1 mm$^2$ to 1 cm$^2$. If the focal plane array 10 is fabricated from a single silicon wafer (as described below), then the focal plane array 10 may comprise from around 100 to 10,000 or more radiometer pixels 100.

The exploded portion of FIG. 1 shows two adjacent radiometer pixels 100 along with an integrated circuit 115 that combines the outputs from multiple radiometer pixels. The plurality of radiometer pixels 100 comprises a layered three-dimensional structure with one layer of antennas 131, one or more layers of polymer dielectric film 120 with millimeter wave radiometer microwave monolithic integrated circuits (MMICs) 121 embedded within, and a final layer comprising a substrate layer 110 that serves as the base for the structure. In addition to serving as a foundation for the array, the substrate layer 110 preferably contains radiometer processor integrated circuits 111 to collect and process the signals from each radiometer MMIC 121. Connections between the antennas 131 and the radiometer MMICs 121 are preferably made by high frequency vertical interconnects (vias) 122, while connections between the radiometer MMICs 121 and the integrated circuits are preferably made by low frequency vias 112. The substrate layer 110 may also contain additional circuitry 115 to collect and process the signals from each integrated circuit 111 and to generate a full-frame video signal. The combination of a single antenna 131, a radiometer MMIC 121, and a radiometer processor integrated circuit 111 forms a single radiometer pixel 100. FIG. 1 illustrates the structure of two such radiometer pixels within the millimeter wave focal plane array 10.

Figure 2:
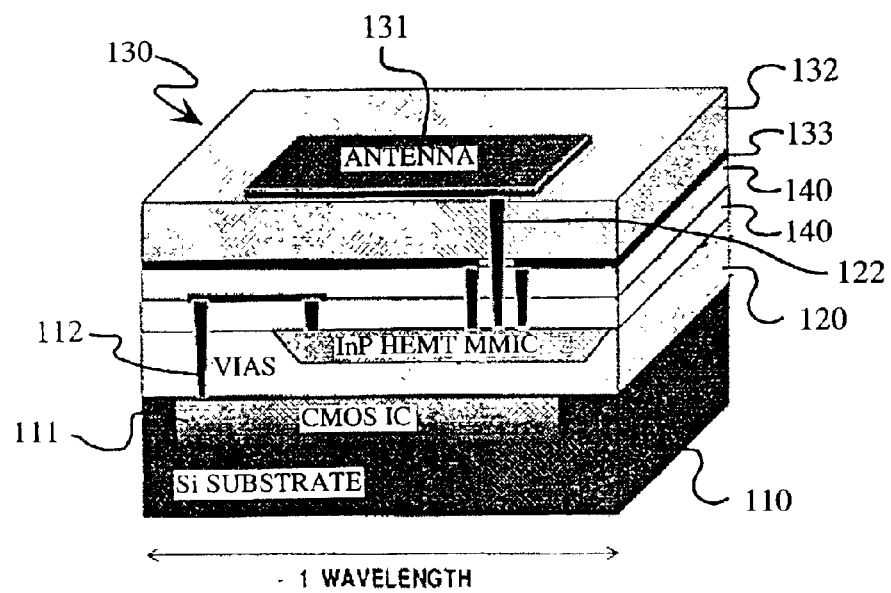
FIG. 2 shows a physical representation of the various layers used within a single radiometer pixel of the present invention.

FIG. 2 illustrates the physical relationship of the various layers of one embodiment of the present invention. FIG. 2 shows the substrate layer 110, the receptacle layer 120, encapsulation layers 140, and a top antenna carrying layer 130. These layers are bonded together so as to provide an integral three-dimensional structure. The substrate comprises silicon or another material such as GaAs or another group III-V semiconductor in which integrated circuits are formed. A silicon substrate is preferable since it is low cost and offers very high levels of integration for circuits formed within it. The substrate layer 110 contains multiple radiometer processor integrated circuits 111 for processing millimeter wave video signals. The integrated circuits 111 use Si CMOS or SiGe CMOS technology or other technologies appropriate for integrated circuits formed within the substrate layer 110. Along with containing integrated circuits 111, the substrate layer 110 forms the host or base upon which the receptacle layer 120 is registered. As a base structure, a silicon substrate is also preferable due to its structural sturdiness.

The receptacle layer 120 comprises a thermoplastic polymer dielectric chosen for its specific radio frequency characteristics and for its forming temperature. The receptacle layer 120 receives the radiometer MMICs 121 used for processing received RF signals. The receptacle layer 120 is preferably micro-stamped with specially-shaped receptacles prior to the receipt of the MMICs 121, so as to allow the MMICs 121 with corresponding specially-shaped locating features to be positioned and retained within the receptacle layer 120. These MMICs 121 can be fully fabricated and tested before they are placed into the receptacle layer 120, providing for improved yields for focal plane arrays fabricated using this technology. The MMICs 121 are then encapsulated by an encapsulation layer 140 as described below. The receptacle layer 120 is bonded to the substrate layer110. Exemplary processes for preparing the receptacle layer 120 for receipt of the MMICs 121, transfer and encapsulation of the MMICs 121, and bonding the receptacle layer 120 to the substrate layer 110 are described and claimed in the copending patent applications entitled "Process for Assembling Three-Dimensional Systems on a Chip and Structure Thus Obtained," Serial No. 60/326,076; "Method For Assembly Of Complementary-Shaped Receptacle Site And Device Microstructures," Serial No. 60/326,055, and "Method of Self-Latching for Adhesion During Self-Assembly of Electronic or Optical Circuits," Serial No. 60/326,056. However, other processes than those described in these copending patent applications may also be used fabricating embodiments of the present invention.

The MMICs 121 contained in the receptacle layer 120 use semiconductor technology appropriate for processing millimeter wave signals. Such technologies include low noise InP high-electron-mobility transistor (HEMT) technology and GaAs heterojunction bipolar transistor (HBT) technology. These technologies make it possible to directly amplify the millimeter wave radiation at each pixel in a focal plane and to rectify these signals. The required amplification and rectification functions may be provided by a plurality of MMICs or these functions may be integrated into a single MMIC.

The encapsulation layers 140 cover the MMICs 121 contained in the receptacle layer 120 and positionally fix them in the receptacle layer 120. The encapsulation layers 140 comprise material similar to the material used for the receptacle layer 120, in that the material provides a similar temperature expansion and also has good dielectric properties. Interconnects from the MMICs 121 in the receptacle layer 120 to the integrated circuits 111 in the substrate layer 110 may be supported by the encapsulation layer 140 above the MMICs 121. These interconnects can be provided by the evaporation of metal on top of the encapsulation layer 140. Vias 112 are used to make connections through the encapsulation 140 and receptacle layers 120 to the integrated circuits located in those layers and the interconnects located on top of the encapsulation layer 140. The vias 112 can be constructed by stamped holes containing vacuum deposited metal or by other techniques well-known in the art. Exemplary processes for producing the required vias are disclosed in the copending patent application entitled "Process for Producing High Performance Interconnects," Serial No. 60/326,054. Other processes known in the art for forming vias may also be used.

Special attention must be paid to the formation of the interconnects used for carrying RF signals, such as the interconnects between the MMICs 121 and the antenna elements 131. These interconnects are generally more complex than the interconnects used for low frequency signals, such as the interconnects between the MMICs 121 and the integrated circuits 11 in the substrate. These RF interconnects are generally either coaxial or coplanar structures. Electromagnetic modeling is generally required to determine ohmic and radiation losses. The RF interconnects incorporate both shielding and grounding structures to efficiently transition between layers. The RF interconnects may include coaxial vias, coaxial vias with coplanar-waveguide micro strip interlevel transitions, and coplanar-waveguide to coplanar-waveguide interlevel transitions. The low frequency interconnects are generally simple via interconnects structures such as single metal lines.

Other methods can be used for connecting the MMICs 121 in the receptacle layer 120 to the integrated circuits 111 in the substrate layer 110. Vias 112 can be used to connect directly from the bottom of the MMICs 121 in the receptacle layer 120 to the integrated circuits 111 in the substrate layer 110. Such a method of fabrication would eliminate the need for metal interconnects on top of an encapsulation layer 140. However, direct connections between the MMICs 121 and the integrated circuits 11 may be more difficult to fabricate and more subject to failure. The MMIC interconnection metal could also be placed directly on the receptacle layer 120 and vias used to connect to the integrated circuits 111 below. This method may also be more subject to failure due to the effects of thermal expansion causing the connection between the interconnection metal and the MMIC to crack.

Another embodiment of the present invention has multiple receptacle layers 120 with each receptacle layer 120 supporting integrated circuits 121 of the same or different semiconductor technology. This embodiment allows additional processing to be performed on the radio frequency signal received by each antenna element 131 while maintaining a compact size for the focal plane array. Preferably, additional encapsulation layers 140 are used to separate the receptacle layers 120 and to encapsulate the integrated circuits in the receptacle layer 120 below and to provide interconnects between the integrated circuits 121 in the receptacle layers 120 and to the integrated circuits 111 in the substrate. However, the receptacle layers 120 could be stacked one above the other, where the receptacle layer 120 above provides encapsulation for the receptacle layer 120 beneath it.

The antenna carrying layer 130 comprises a dielectric layer 132 upon which an antenna element 131 has been printed. The antenna element 131 couples emitted millimeter wave radiation into the radiometer pixel. Printed antenna elements suitable for coupling millimeter wave radiation are well known in the art. The antenna element size would be on the order of 1/2 wavelength of the millimeter wave emissions to be received. Suitable antenna elements 131 include a microstrip patch above a ground plane, which can receive one of two different linear polarizations depending upon where the feed line connects to the patch. FIG. 2 shows a ground plane 133 provided by a metal layer deposited on an encapsulation layer 140. A metal layer may also be deposited on another dielectric layer located beneath the antenna carrying layer 130 to provide a ground plane 133. The antenna carrying layer 130 would preferably be the thickest layer in the stack of layers of the radiometer pixel 100 and would be comprised of dielectric material having a low dielectric constant. The antenna carrying layer 130 will generally have a thickness of approximately 25 microns, although the thickness will vary depending upon the frequency at which the focal plane array 10 operates and the type of antenna structure deposited on the layer 130.

Other suitable printed antenna elements for use in the present invention include a dipole or a spiral-type antenna. A dipole may be less efficient than a patch due to the proximity of the dielectric and metal layers. A spiral antenna could be used in cases where a wider signal bandwidth or sensitivity to various polarizations are desired.

Connections between an antenna element 131 and a MMIC 121 in the receptacle layer 120 are made by high frequency vias 122. Such high frequency vias can be formed by techniques well-known in the art. Stamped holes in which metal has been vacuum deposited for connections through the antenna carrying layer 130, the ground plane 133, and any encapsulation layers 140 is one method for providing the necessary connections. Other possible methods for fabricating the required vias are described in the copending patent application entitled "Process for Producing High Performance Interconnects," Serial No. 60/326,054 as discussed above.

Producing a good quality millimeter wave image requires high spatial resolution. Spatial resolution is limited by diffraction, so the optimum spacing between detector elements in the focal plane array is 0.5 to 1 wavelengths. Therefore each millimeter wave detector should fit into a space that is 1 to 10 millimeters on a side. The three dimensional structure of the present invention illustrated in FIG. 2 easily satisfies this need. The reduced size of each detector resulting from the vertical integration of the present invention allows a much denser array to be formed than that provided by prior art.

Figure 3:
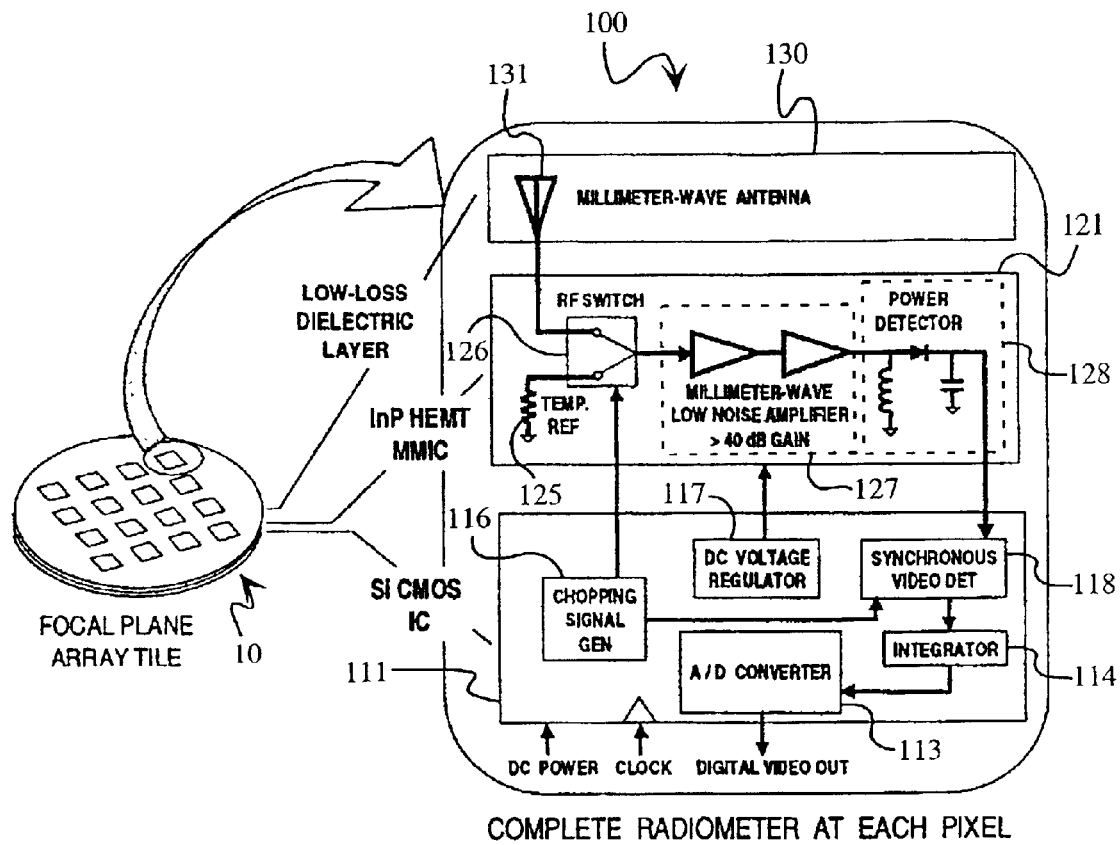
FIG. 3 shows a block diagram of the electronic elements used in one embodiment of a radiometer pixel of the present invention.

FIG. 3 shows a block diagram of the elements in a single radiometer pixel 100 of one embodiment of the present invention to provide detection of millimeter wave radiation. This embodiment utilizes a simple diode detector and an analog-to-digital converter to provide a digital representation of the millimeter wave radiation present at a pixel. The key advantage of the present invention is that this functionality can be provided in a single three-dimensional structure.

As shown in FIG. 3, an antenna element 131 in the antenna carrying layer 130 is coupled to a MMIC 121 in the receptacle layer 120. The MMIC 121 contains a radio frequency (RF) switch 126 that switches between the signal provided by the antenna element 131 and a temperature reference 125. The RF switch 126 samples signals from either the antenna element 131 or the temperature reference 125, which is a calibrated reference load. An externally applied bias voltage (shown applied by a chopping signal generator 116 in FIG. 3), operating at video frequencies, causes the RF switch 126 to periodically change connections between the antenna element 131 and the temperature reference 125. The use of a temperature stabilized reference load is commonly used for absolute temperature calibration of a millimeter wave detector.

The output of the radio frequency switch 126 is provided to a low noise amplifier 127. The low noise amplifier 127 delivers amplified RF signals to a power detector 128. The power detector 128 integrates the RF signal to produce a video output signal that is proportional to the RF input power. A typical circuit for detecting millimeter wave energy is further described by Lo et al. in "Monolithic, Low-Noise, Synchronous Direct Detection Receiver For Passive Microwave/Millimeter-Wave Radiometric Imaging Systems," U.S. Pat. No. 5,815,113, issued Sep. 29, 1998, incorporated herein by reference.

Figure 5:
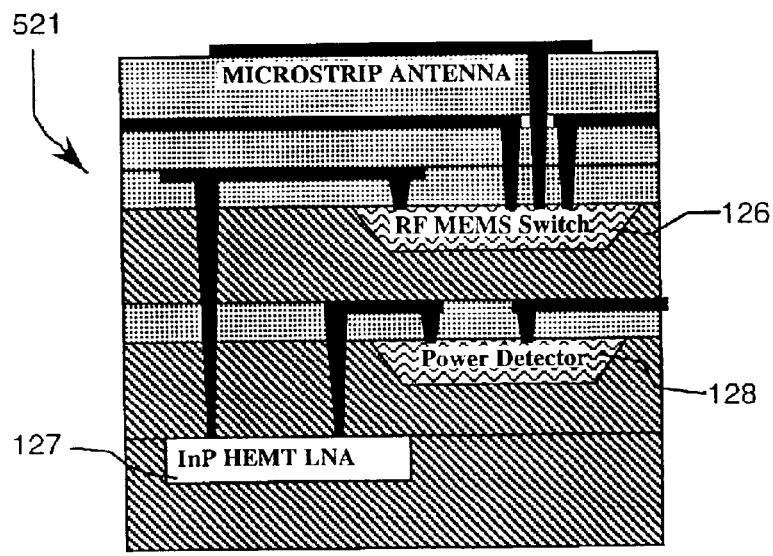
FIG. 5 shows a simplified representation of a three dimensional multiple layer structure providing a microwave monolithic integrated circuit for use as a radiometer in the present invention.

Alternatively, the MMIC 121 for detecting millimeter wave energy may itself be implemented by a three dimensional multiple layer structure 521, as shown in FIG. 5. In FIG. 5, the RF switch 126 is contained in one layer, the power detector 128 is contained in a second layer, and the low noise amplifier 127 is contained in a third layer. In the three dimensional structure 521, the RF switch 126 is preferably a very low insertion loss, metal contact RF MEMS switch built on a GaAs substrate. Low insertion loss is an important feature for the RF switch 126. The low noise amplifier 127 is preferably a high electron mobility transistor (HEMT) built on a InP substrate. A low noise figure is an important feature of the low noise amplifier 127. The power detector 128 is preferably a quantum tunneling heterostructure that uses a nearly lattice matched InAs/AlSb/GaSb system grown on an InAs substrate. A linear response and circuit simplicity are important features for the power detector 128.

As discussed above, the preferable RF switch 126 in the three-dimensional structure 521 used for detecting millimeter wave energy is an RF MEMS switch. Very low insertion loss RF MEMS switches built on GaAs substrates may exhibit less than 0.2 dB insertion loss up to 40 GHz, with switch isolation greater than 60 dB at frequencies less than 5 GHz, and greater than 25 dB at 40 GHz. Two main types of RF MEMS switches known in the art are actuated by electrostatic forces—the metal contact series switch and the membrane shunt switch. The series switch is considered a true switch since it utilizes a cantilever beam that closes every time the metal contact is made and opens when the cantilever is released. A membrane shunt switch operates based on the position of the electrostatically actuated membrane. When the membrane is up, the RF signal goes through the transmission line located beneath the membrane. When the membrane is pulled down, the switch capacitance will couple the RF signal to ground, corresponding to a switch open position. Although both types of switches demonstrate excellent insertion losses (less than 0.2 dB over a very broad frequency band from DC to millimeter wave), the series switch provides better isolation characteristics at operating frequencies above 5 GHz, and, therefore, is preferable for use in the three dimensional structure 521 used for detecting millimeter wave energy.

The low noise amplifier 127 in the three-dimensional structure 521 used for detecting millimeter wave energy preferably comprises an HEMT built on an InP substrate. An InP HEMT two-stage low noise amplifier that exhibits a small signal gain of 7.2 dB at 190 GHz is known in the art. This known amplifier employs AlInAs/GaInAS/InP HEMT devices with 0.1×40 μm periphery and is implemented with coplaner waveguide circuitry fabricated on an InP substrate. Gain exceeding 10 dB has been measured from 129–157 GHz. InP HEMT devices provide higher gain and lower noise at higher operating frequencies as compared to other solid-state devices such as GaAs-based FETs. These characteristics are due to the superior electron mobility and velocity on the high indium content GaInAs channel, along with increased carrier density in the channel due to the large conduction band discontinuity at the AlInAs/GaInAs heterojunction.

The power detector 128 in the three-dimensional structure 521 used for detecting millimeter wave energy is preferably a backward diode. A preferred diode device is closely related to a Ge Esaki diode, but uses modern epitaxial growth technology to fabricate precisely tailored quantum tunneling heterostructures using the nearly lattice matched InAs/AlSb/GaSb system. This preferred diode device provides significant advantages over other types of diodes that may be used for RF power detection. Specifically, the preferred diode provides a greater bandwidth than that provided by Ge diodes, and a bandwidth as good or better than Schottky diodes. The preferred diode has zero bias operation, which Ge diodes also have, but Schottky diodes do not. The preferred diode has better sensitivity, that is, greater curvature at zero bias, than other diode types, which leads to greater dynamic range. Finally, the preferred diode has better linearity, which is provided by careful band engineering, to ensure ideal quadratic curvature.

Returning to FIG. 3, the video signal generated by the MMIC 121 is coupled to a synchronous video detector 118 in the radiometer processor integrated circuit 111, which is preferably contained in the substrate layer. A chopping signal generator 116 controls the synchronous video detector 118 and the radio frequency switch 126 in the MMIC 121 so that the difference in millimeter wave power between the radiated millimeter wave image and a temperature reference can be measured. The difference in these two values provides the effective temperature of the image emitting millimeter wave radiation. An integrator 114 integrates the video signal, which is provided to an analog-to-digital converter 113 to provide a digital video signal output.

A high quality millimeter wave image also requires high temperature resolution and a rapid refresh rate. The time it takes to produce a millimeter wave radiation image depends ultimately on the number of detectors operating in parallel, and the integration time τ required by each detector to measure temperature $T_{scene}$ with an uncertainty ΔT. High quality images typically require a ΔT resolution of at least 0.5 K, and higher resolution is especially desired for indoor applications like security screening. Integration time is minimized by using a receiver with a wide bandwidth B and low noise $T_{sys}$, according to the radiometer law:

$$\Delta T = \frac{T_{sys} + T_{scene}}{\sqrt{B\tau}}$$

High performance low noise amplifiers (LNA) provided as discrete devices are well-known in the art. For example, 30 GHz LNAs with a 10 GHz bandwidth can provide a $T_{sys}$ of 170° K. With such an LNA, a typical scene at a millimeter wave temperature of 300° K can be detected with a resolution ΔT of 0.5° K in 85 μs and a resolution of ΔT of 0.1° K in 2.2 ms. Other LNAs with a 10 Ghz bandwidth provide a $T_{sys}$ of 600° K. LNAs implemented by using one or more MMICs have similar characteristics. With an LNA with the characteristics described above, a typical scene at 300° K can be detected with a resolution of 0.5° K in 320 μs and 0.1° K in 8 ms. With such devices, it is possible to generate images with exceptional 0.1° K resolution at video rates exceeding 100 frames per second, provided that each detector element has its own video processor and the antenna-to-LNA connection is of minimum length.

Vertical integration of radiometer pixels onto a substrate and the small size of the pixels allows for multiple pixels to be constructed on a substrate. One embodiment of the present invention provides for the construction of a focal plane radiometer array structure on a single silicon wafer. Such a wafer may be 3" (7.6 cm) to 8" (20.3 cm) in diameter. The silicon wafer is constructed to contain multiple integrated circuits for processing millimeter wave video signals. A receptacle layer and antenna carrying layer are deposited on the silicon wafer substrate to create the focal plane radiometer array. The relatively small size of the wafer-based focal plane array would provide the capability for handheld millimeter wave imagers. An alternative embodiment of the present invention is provided by combining multiple wafer-based focal plane arrays into a single array structure. This structure would provide for a larger field of view and/or a higher resolution image.

Figure 4:
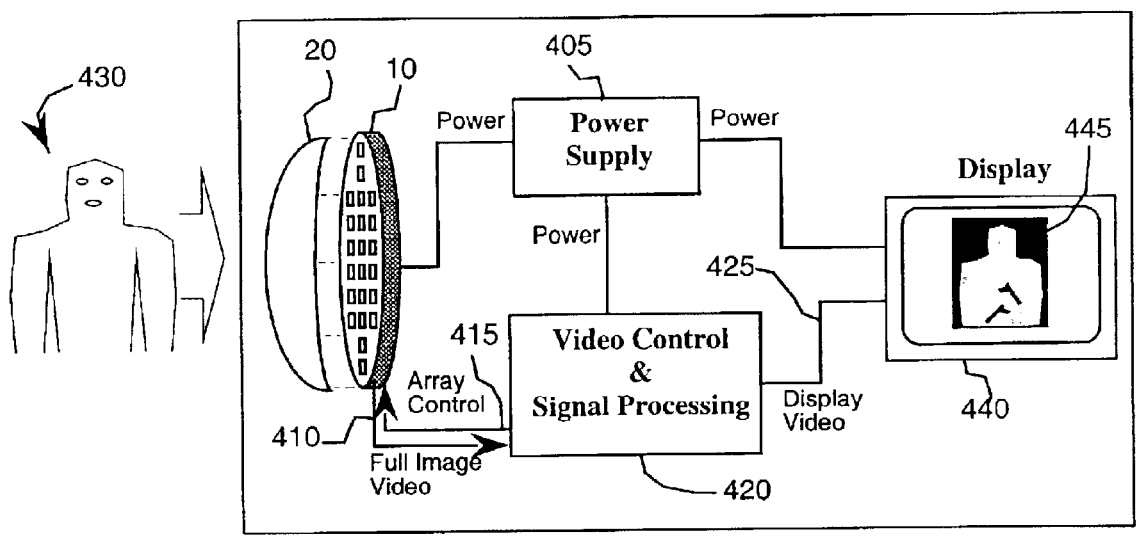
FIG. 4 illustrates a block diagram for a millimeter wave imaging system according to the present invention.

A millimeter wave imaging system 400 using the single wafer embodiment of the focal plane array provided by the present invention is illustrated in FIG. 4. The focal plane array 10 on a single wafer is positioned behind a focusing device 20 so that a scene 430 to be imaged is focused upon the focal plane array 10. The focusing device 20 may be adjustable to allow a viewed image to be enlarged or shrunken as would be provided by a zoom lens. The focal plane array 10 receives and processes millimeter wave radiation from the scene 430 and provides a full image video output 410 that is continuously updated. The update rate depends upon the desired resolution, as described above. The full image video output 410 is provided to a video control and signal processor unit 420 that may perform additional processing on the millimeter wave image. The video control and signal processor unit then transfers the image to a video display 440. The video display produces an image 445 based on the millimeter wave radiation detected from the scene 430. The video display 440 may comprise a CRT or other display devices, but, preferably, the display 440 is a liquid crystal display so that the cost, weight and size of the millimeter wave imaging system 400 can be kept as low as possible. A power supply 405 is used to provide power to all the active components in the system. Since the focal plane array 10 may be provided with a single wafer, the entire millimeter wave imaging system 400 may be contained in a single enclosure with a size and weight amenable for use as a handheld unit. Multiple wafers may be used to make up the focal plane array 10, which may increase the size of the enclosure in which the millimeter wave imaging system 400 is contained. Use of multiple wafers may also require that the video control and processor unit 420 process multiple full image video outputs 410.

From the foregoing description, it will be apparent that the present invention has a number of advantages, some of which have been described above, and others of which are inherent in the embodiments of the invention described herein. Also, it will be understood that modifications can be made to the apparatus for millimeter wave imaging described herein without departing from the teachings of the subject matter described herein. As such, the invention is not to be limited to the described embodiments except as required by the appended claims.

What is claimed is:

1. An apparatus for millimeter wave imaging comprising:
a substrate comprising a first plurality of integrated circuits;
one or more receptacle layers positioned on top of the substrate, each receptacle layer of the one or more receptacle layers comprising:
a second plurality or integrated circuits encapsulated in a polymer film,
a plurality of vertical interconnect; and
an antenna carrying layer comprising:
an antenna dielectric layer and
a plurality of antenna elements positioned on top of the antenna dielectric layer.

2. The apparatus according to claim 1 further comprising:
one or more first encapsulation layers, each encapsulation layer located above each receptacle layer of said one or more receptacle layers and at least one encapsulation layer of the one or more encapsulation layers comprising:
a dielectric layer and
a plurality of horizontal interconnects deposited on top of the dielectric layer, the plurality of horizontal interconnects connecting the vertical interconnects, the first plurality of integrated circuits, and the second plurality of integrated circuits.

3. The apparatus according to claim 1 further comprising:
a metal layer deposited beneath the antenna dielectric layer; and
a ground plane dielectric layer located beneath the metal layer.

4. The apparatus according to claim 1 wherein said plurality of antenna elements are arranged such that each antenna element in said plurality of antenna elements is separated from another antenna element in two perpendicular directions.

5. The apparatus according to claim 1 wherein each integrated circuit of the second plurality of integrated circuits comprises a radiometer having:
a radio frequency input connected to a single antenna element of said plurality of antenna elements;
a control input;
a power input; and,
a video output;
and wherein each integrated circuit of the first plurality of integrated circuits comprises a radiometer processor having:
a control output connected to the control input of said radiometer;
a power output connected to the power input of said radiometer;
a video input connected to the video output of said radiometer;
a digital video output;
a direct current input; and,
a clock input.

6. The apparatus according to claim 5 wherein the radiometer comprises:
a temperature reference;
a radio frequency switch having a first input connected to the radio frequency inputs, second input connected to the temperature reference, and a switch output, the radio frequency switch connecting the first input or the second input to the switch output, and the radio frequency switch controlled by the control input;
a low noise amplifier having an amplifier input and an amplifier output, the amplifier input connected to the switch output; and
a power detector having a detector input and a detector output, the detector input connected to the amplifier output, and the detector output connected to the video output.

7. The apparatus according to claim 5 wherein the radiometer processor comprises:
a direct current voltage regulator providing regulated power to the power output;
a chopping signal generator with chopping output, the chopping output connected to the control output;
a synchronous video detector connected to the video input and to the chopping output and providing a detected video output;
an integrator connected to the detected video output and providing an integrated video output; and
an analog-to-digital convener connected to the integrated video output and providing the digital video output.

8. The apparatus according to claim 5 wherein said radiometer comprises a microwave monolithic integrated circuit.

9. The apparatus according to claim 8 wherein said microwave monolithic integrated circuit comprises a three dimensional multiple layer structure, the three dimensional multiple layer structure comprising:
an RF MEMS switch in a first layer, the RF MEMS switch having a first input connected to the radio frequency input, a second input connected to a temperature reference, and an RF switch output, said RF MEMS switch being controlled by said control input;
a low noise amplifier integrated circuit in a second layer, said low noise amplifier integrated circuit having an amplifier input and an amplifier output, said amplifier input being connected to said RF switch output; and
a power detector integrated circuit in a third layer, said power detector integrated circuit having a power detector input connected to said amplifier output and having a power detector output connected to said video output.

10. The apparatus according to claim 9 wherein said low noise amplifier integrated circuit comprises an HEMT built on an InP substrate.

11. The apparatus according to claim 9 wherein said power detector integrated circuit comprises a backward diode.

12. A millimeter wave focal plane array comprising:
one or more focal plane array structures comprising:
a semiconductor wafer;
a first plurality of integrated circuits formed within the semiconductor wafer;
one or more receptacle layers positioned on top of the semiconductor wafer, each receptacle layer comprising a second plurality of integrated circuits encapsulated in a polymer film; and
an antenna carrying layer positioned on top of the receptacle layer, the antenna carrying layer comprising:
an antenna dielectric layer and
a plurality of antenna elements positioned on top of the antenna dielectric layer.

13. The millimeter wave focal plane array according to claim 12 wherein at least one integrated circuit in the second plurality of integrated circuits comprises a radiometer and at least one integrated circuit in the first plurality of integrated circuits comprises a radiometer processor connected to said radiometer.

14. The millimeter wave focal plane array according to claim 13 further comprising:
a video frame processor connected to every radiometer processor.

15. The millimeter wave focal plane array according to claim 13 wherein said radiometer comprises a three dimensional multiple layer structure, the three dimensional multiple layer structure comprising:
an RF MEMS switch in a first layer, the RF MEMS switch having a first input connected to one antenna element of the plurality of antenna elements, a second input connected to a temperature reference, and an RF switch output;
a low noise amplifier integrated circuit in a second layer, said low noise amplifier integrated circuit having an amplifier input and an amplifier output, said amplifier input being connected to said RF switch output; and
a power detector integrated circuit in a third layer, said power detector integrated circuit having a power detector input connected to said amplifier output and having a power detector output.

16. The millimeter wave focal plane array according to claim 15 wherein said low noise amplifier integrated circuit comprises an HEMT built on an InP substrate.

17. The millimeter wave focal plane array according to claim 15 wherein said power detector integrated circuit comprises a backward diode.

18. A millimeter wave imaging system for producing a display based on millimeter wave radiation received from a viewed scene, said system comprising:
a millimeter wave focal plane array producing full image video signal, said array comprising
a substrate containing a plurality of substrate integrated circuits;
one or more receptacle layers, each receptacle layer comprising a plurality of radiometer integrated circuits encapsulated in a polymer film; and
an antenna carrying layer having a plurality of antenna elements; and
a lens directing the viewed scene onto the millimeter wave focal plane array;
a processing unit receiving the full image video signal and producing a display video signal; and
a video display generating a visual display from the display video signal.

19. The millimeter wave imaging system according to claim 18 wherein said substrate comprises a single silicon wafer.

20. The millimeter wave imaging system according to claim 18 wherein said substrate comprises multiple silicon wafers.

21. The millimeter wave imaging system according to claim 18 wherein one substrate integrated circuit of said plurality of substrate integrated circuits comprises circuitry to generate a full frame video signal and each remaining substrate integrated circuits of plurality of substrate integrated circuits comprises a radiometer processor.

22. The millimeter wave imaging system according to claim 18 wherein each radiometer integrated circuit of said plurality of radiometer integrated circuits comprises a three dimensional multiple layer structure, the three dimensional multiple layer structure comprising:
an RF MEMS switch in a first layer, the RF MEMS switch having a first input connected to one antenna element of the plurality of antenna elements, a second input connected to a temperature reference, and an RF switch output;
a low noise amplifier integrated circuit in a second layer, said low noise amplifier integrated circuit having an amplifier input and an amplifier output, said amplifier input being connected to said RF switch output; and
a power detector integrated circuit in a third layer, said power detector integrated circuit having a power detector input connected to said amplifier output and having a power detector output.

23. The millimeter wave imaging system according to claim 18 wherein the system is contained within a single handheld enclosure.

24. The millimeter wave imaging system according to claim 18 wherein the lens is a zoom lens.

25. The millimeter wave imaging system according to claim 18 wherein the video display comprises a liquid crystal display.

* * * * *